(12) United States Patent
Kurita

(10) Patent No.: US 9,490,077 B2
(45) Date of Patent: Nov. 8, 2016

(54) SOLID ELECTROLYTIC CAPACITOR AND MOUNTING ASSEMBLY

(71) Applicant: Panasonic Intellectual Property Management Co., Ltd., Osaka (JP)

(72) Inventor: Junichi Kurita, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/885,286

(22) Filed: Oct. 16, 2015

(65) Prior Publication Data

US 2016/0042873 A1 Feb. 11, 2016

Related U.S. Application Data

(63) Continuation of application No. PCT/JP2014/002256, filed on Apr. 22, 2014.

(30) Foreign Application Priority Data

Apr. 26, 2013 (JP) .................................. 2013-093453

(51) Int. Cl.
  *H05K 1/16* (2006.01)
  *H01G 9/012* (2006.01)
  (Continued)

(52) U.S. Cl.
  CPC ................ *H01G 9/012* (2013.01); *H01G 2/06* (2013.01); *H01G 9/08* (2013.01); *H01G 9/14* (2013.01); *H01G 9/15* (2013.01); *H05K 1/11* (2013.01); *H05K 1/181* (2013.01)

(58) Field of Classification Search
  CPC .......... H01G 9/012; H01G 2/06; H01G 9/14; H01G 9/15; H01G 9/08; H05K 1/11; H05K 1/181
  USPC ........................................................ 174/260
  See application file for complete search history.

(56) References Cited

U.S. PATENT DOCUMENTS

| 2007/0019366 A1 | 1/2007 | Yamaguchi et al. |
| 2010/0214038 A1 | 8/2010 | Kurita et al. |
| 2013/0329341 A1 | 12/2013 | Kurita et al. |

FOREIGN PATENT DOCUMENTS

| JP | 2006-100295 | 4/2006 |
| JP | 2007-035691 | 2/2007 |
| JP | 2008-021771 | 1/2008 |

(Continued)

OTHER PUBLICATIONS

International Search Report of PCT application No. PCT/JP2014/002256 dated Aug. 5, 2014.

Primary Examiner — Tremesha S Willis
(74) Attorney, Agent, or Firm — McDermott Will & Emery LLP

(57) ABSTRACT

A solid electrolytic capacitor includes: a first capacitor element unit and a second capacitor element unit electrically insulated from each other. The first capacitor element unit includes a first anode portion and a first cathode portion respectively and electrically connected to a first anode bottom exposed portion and a first cathode bottom exposed portion exposed from an outer package. The second capacitor element unit includes a second anode portion and a second cathode portion respectively and electrically connected to a second anode bottom exposed portion and a second cathode bottom exposed portion exposed from the outer package. At the bottom surface of the outer package, the first cathode bottom exposed portion is disposed between the first anode bottom exposed portion and the second cathode bottom exposed portion, and the second cathode bottom exposed portion is disposed between the second anode bottom exposed portion and the first cathode bottom exposed portion.

13 Claims, 6 Drawing Sheets

(51) Int. Cl.
*H01G 2/06* (2006.01)
*H01G 9/14* (2006.01)
*H01G 9/15* (2006.01)
*H01G 9/08* (2006.01)
*H05K 1/11* (2006.01)
*H05K 1/18* (2006.01)

(56) References Cited

FOREIGN PATENT DOCUMENTS

| | | |
|---|---|---|
| JP | 2008-166760 | 7/2008 |
| JP | 2008-258193 | 10/2008 |
| JP | 2010-226139 | 10/2010 |
| WO | 2009/063618 | 5/2009 |
| WO | 2012/140836 | 10/2012 |

SOLID ELECTROLYTIC CAPACITOR AND MOUNTING ASSEMBLY

BACKGROUND

1. Technical Field

The present disclosure relates to chip-type solid electrolytic capacitors which can be surface-mounted, and mounting assemblies.

2. Description of the Related Art

With higher speed and higher frequency operation of an electronic device, research has been conducted to improve an impedance characteristic of a capacitor.

In particular, there has been a strong demand for a reduction in size and an increase in capacitance of a solid electrolytic capacitor used around the central processing unit (CPU). Additionally, in response to the higher frequency operation of an electronic device, there has been a strong demand for a solid electrolytic capacitor to have a low equivalent series resistance (ESR), high noise-reduction performance, quick transient response, and low equivalent series inductance (ESL).

As FIG. 1 illustrates, conventional solid electrolytic capacitor 200 includes a plurality of plate-like capacitor elements.

Cathode portion 204 of first capacitor element 201 and cathode portion 204 of second capacitor element 202 are stacked. Anode portion 203 of first capacitor element 201 and anode portion 203 of second capacitor element 202 respectively extend in a first direction and a second direction which are opposite to each other across stacked cathode portions 204. Anode portion 203 of first capacitor element 201 which extends in the first direction is joined to first anode terminal 206. Anode portion 203 of second capacitor element 202 which extends in the second direction is joined to second anode terminal 207.

Insulating layer 205 is disposed around the outer periphery of an end portion of each of cathode portions 204 of first capacitor element 201 and second capacitor element 202. Cathode portion 204 of first capacitor element 201 and cathode portion 204 of second capacitor element 202 are electrically insulated from each other by insulating layers 205.

First capacitor element 201 is electrically connected to first cathode terminal 208 via first cathode frame 212 and conductive paste 210. First capacitor element 201 is electrically insulated from second cathode terminal 209 by insulating paste 211. In a similar manner to first capacitor element 201, second capacitor element 202 is electrically connected to second cathode terminal 209 via second cathode frame 213 and conductive paste 210. Second capacitor element 202 is electrically insulated from first cathode terminal 208 by insulating paste 211.

As FIG. 2 illustrates, bottom exposed portion 218 of first cathode terminal 208 is connected to cathode portion 204 of first capacitor element 201. Bottom exposed portion 219 of second cathode terminal 209 is connected to cathode portion 204 of second capacitor element 202. Bottom exposed portions 218 and 219 extend along an axis connecting bottom exposed portion 216 of first anode terminal 206 and bottom exposed portion 217 of second anode terminal 207. Bottom exposed portion 218 and bottom exposed portion 219 are opposite to each other across the axis.

With such a structure, high-frequency noise components included in the current applied to solid electrolytic capacitor 200 flows into two independent first cathode terminal 208 and second cathode terminal 209, and efficiently flows into the ground of the circuit board. This improves the impedance characteristic of the solid electrolytic capacitor used in a high-frequency region.

For example, Patent Literature (PTL) 1 discloses a conventional technique related to the present disclosure.

CITATION LIST

Patent Literature

PTL 1: International Publication No. WO2009/063618

SUMMARY

However, such a conventional solid electrolytic capacitor has an insufficient impedance characteristic in the high-frequency region when an electronic device operates at higher speed and higher frequency.

An object of the present disclosure is to provide a solid electrolytic capacitor having an excellent impedance characteristic in the high-frequency region.

According to an aspect of the present disclosure, a solid electrolytic capacitor includes: a first capacitor element unit including a first anode portion and a first cathode portion; a second capacitor element unit including a second anode portion and a second cathode portion, the second capacitor element unit being electrically insulated from the first capacitor element unit; an outer package which covers the first capacitor element unit and the second capacitor element unit; a first anode bottom exposed portion exposed from the outer package, the first anode bottom exposed portion being electrically connected to the first anode portion; a first cathode bottom exposed portion exposed from the outer package, the first cathode bottom exposed portion being electrically connected to the first cathode portion; a second anode bottom exposed portion exposed from the outer package, the second anode bottom exposed portion being electrically connected to the second anode portion; and a second cathode bottom exposed portion exposed from the outer package, the second cathode bottom exposed portion being electrically connected to the second cathode portion. The bottom surface of the outer package has the first anode bottom exposed portion, the first cathode bottom exposed portion, the second anode bottom exposed portion, and the second cathode bottom exposed portion. The first cathode bottom exposed portion is disposed between the first anode bottom exposed portion and the second cathode bottom exposed portion. The second cathode bottom exposed portion is disposed between the second anode bottom exposed portion and the first cathode bottom exposed portion.

According to the present disclosure, the impedance characteristic in the high-frequency region is improved.

DETAILED DESCRIPTION OF THE PREFERRED EMBODIMENTS

Embodiment 1

A solid electrolytic capacitor according to Embodiment 1 will be described.

Figure 3:
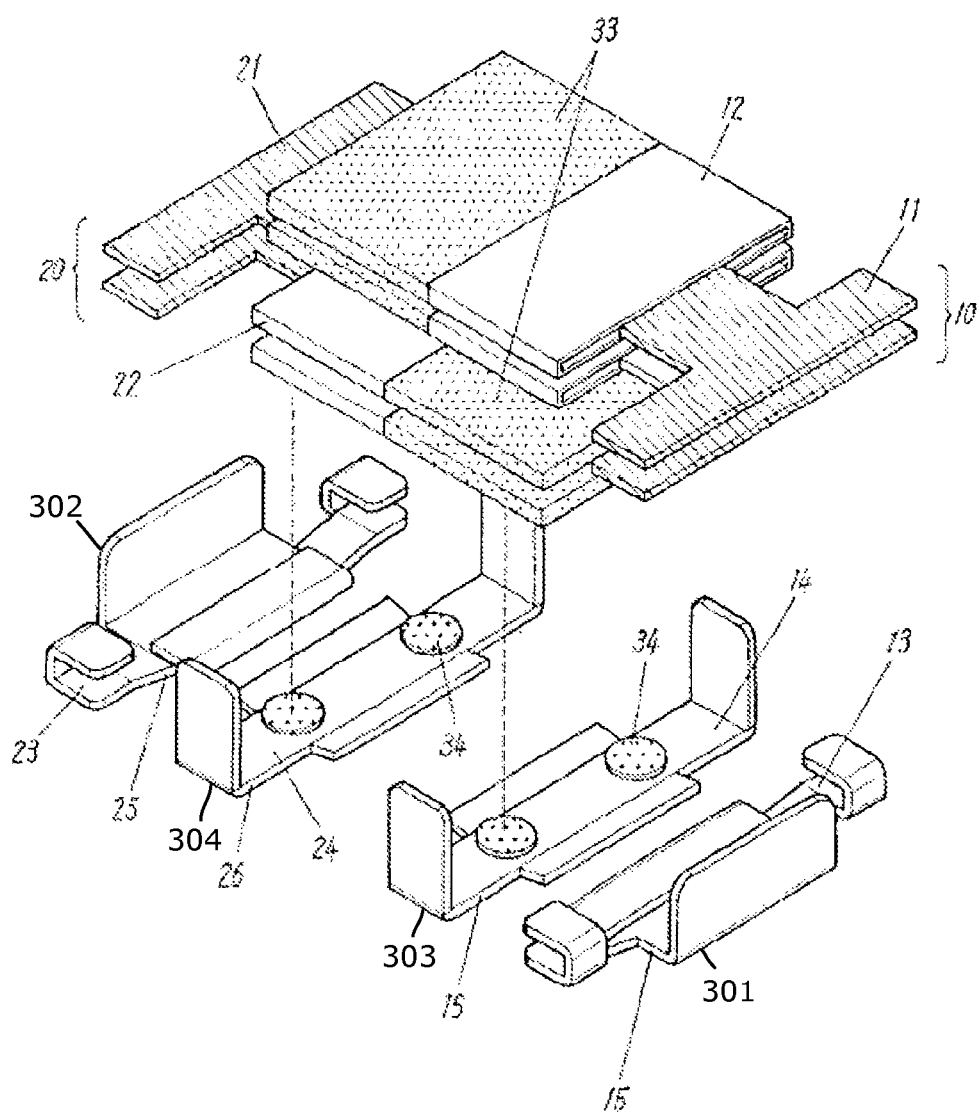
FIG. 3 is an exploded perspective view of a solid electrolytic capacitor according to Embodiment 1.
Figure 4:
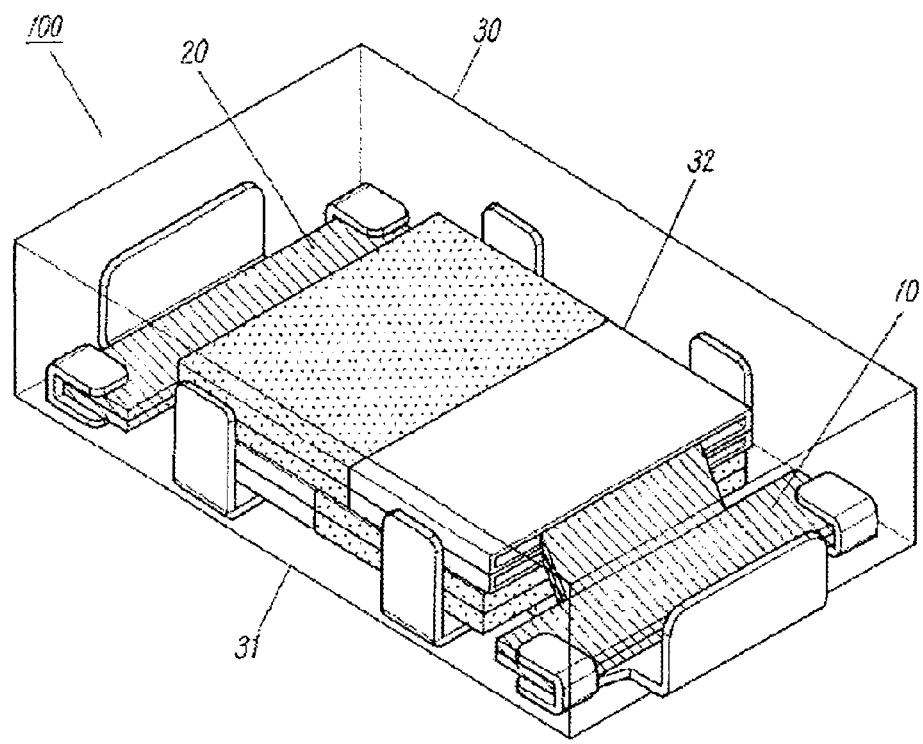
FIG. 4 is a perspective view of the solid electrolytic capacitor according to Embodiment 1.

As FIG. 3 and FIG. 4 illustrate, solid electrolytic capacitor 100 includes: first capacitor element unit 10 including first anode portion 11 and first cathode portion 12; second capacitor element unit 20 including second anode portion 21 and second cathode portion 22; first anode terminal 301 electrically connected to first anode portion 11; first cathode terminal 303 electrically connected to first cathode portion 12; second anode terminal 302 electrically connected to second anode portion 21; and second cathode terminal 304 electrically connected to second cathode portion 22.

First capacitor element unit 10 is electrically insulated from second capacitor element unit 20.

Outer package 30 is made of insulating resin. Outer package 30 covers first capacitor element unit 10 and second capacitor element unit 20.

First anode terminal 301 includes first anode mounting portion 13 having a plate shape. Second anode terminal 302 includes second anode mounting portion 23 having a plate shape. First cathode terminal 303 includes first cathode mounting portion 14 having a plate shape. Second cathode terminal 304 includes second cathode mounting portion 24 having a plate shape.

First anode mounting portion 13 has an upper surface on which first anode portion 11 of first capacitor element unit 10 is mounted. Second anode mounting portion 23 has an upper surface on which second anode portion 21 of second capacitor element unit 20 is mounted. First cathode mounting portion 14 has an upper surface on which first cathode portion 12 of first capacitor element unit 10 is mounted. Second cathode mounting portion 24 has an upper surface on which second cathode portion 22 of second capacitor element unit 20 is mounted.

Figure 11:
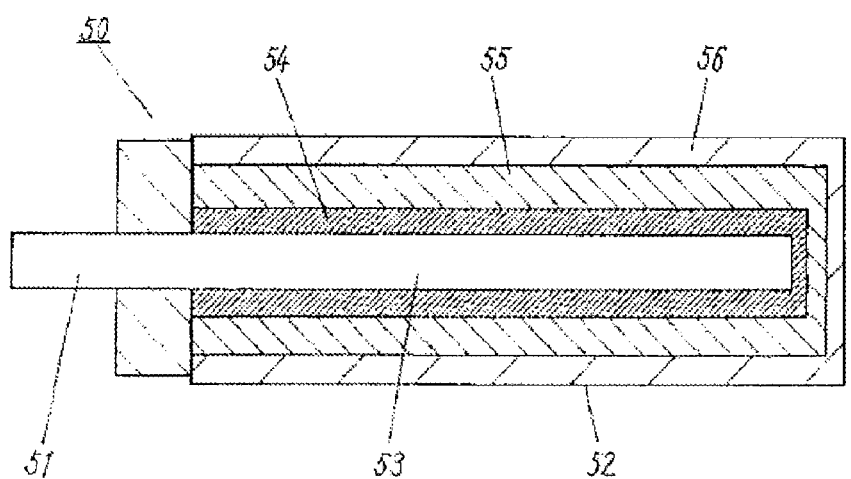
FIG. 11 is a cross-sectional schematic view of a capacitor element.

As FIG. 11 illustrates, capacitor element 50 includes anode portion 51 at one end, and cathode portion 52 at the other end. Anode portion 51 is made of valve metal. Cathode portion 52 includes: anode body 53 made of valve metal; dielectric oxide film 54 formed on the surface of anode body 53; solid electrolyte layer 55 formed on dielectric oxide film 54; and cathode layer 56 formed on solid electrolyte layer 55.

Examples of the valve metal include aluminum, tantalum, and niobium. In order to reduce ESR, solid electrolyte layer 55 includes, for example, a conductive polymer. Cathode layer 56 includes a carbon layer and a conductive paste layer formed on the carbon layer. The conductive paste layer contains conductive powder such as silver.

Anode body 53 of capacitor element 50 may be made of, for example, an aluminum foil.

Each of first capacitor element unit 10 and second capacitor element unit 20 includes one or more capacitor elements 50 having a plate shape.

First anode portion 11 of first capacitor element unit 10 is collectivity of anode portions 51 of one or more capacitor elements 50. First cathode portion 12 of first capacitor element unit 10 is collectivity of cathode portions 52 of one or more capacitor elements 50. Each of second anode portion 21 and second cathode portion 22 of second capacitor element unit 20 is also collectivity.

First cathode portion 12 of first capacitor element unit 10 and second cathode portion 22 of second capacitor element unit 20 are stacked to form cathode stack 32. First anode portion 11 and second anode portion 21 are disposed opposite to each other across cathode stack 32.

Cathode stack 32 at least includes a stack of: cathode portion 52 of one capacitor element 50 of first capacitor element unit 10; and cathode portion 52 of one capacitor element 50 of second capacitor element unit 20.

In cathode stack 32, each of cathode portions 52 of capacitor elements 50 of first capacitor element unit 10 is stacked on one of: cathode portion 52 of capacitor element 50 of first capacitor element unit 10; cathode portion 52 of capacitor element 50 of second capacitor element unit 20; first cathode mounting portion 14; or second cathode mounting portion 24. each of cathode portions 52 of capacitor elements 50 of second capacitor element unit 20 is also stacked on one of: cathode portion 52 of capacitor element 50 of first capacitor element unit 10; cathode portion 52 of capacitor element 50 of second capacitor element unit 20; first cathode mounting portion 14; or second cathode mounting portion 24.

Figure 7:
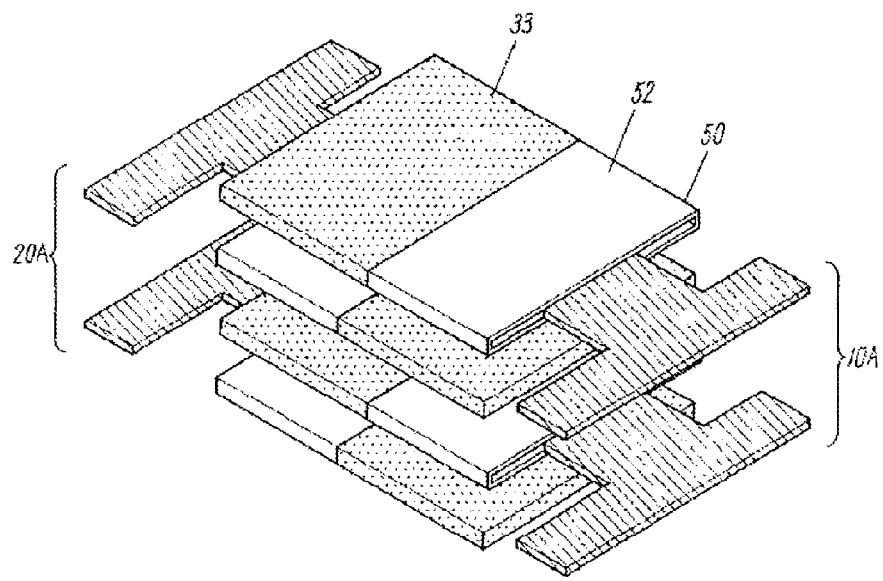
FIG. 7 is an exploded perspective view of another element stack according to Embodiment 1.

As FIG. 7 illustrates, cathode portion 52 of capacitor element 50 of first capacitor element unit 10A and cathode portion 52 of capacitor element 50 of second capacitor element unit 20A may be alternately stacked. In the alternate stack, insulating layer 33 is disposed between cathode portion 52 of capacitor element 50 of first capacitor element unit 10A and cathode portion 52 of capacitor element 50 of second capacitor element unit 20A.

As insulating layer 33, any insulating layer may be used which electrically insulates between cathode portions 52 of different capacitor element units. For example, insulating layer 33 is formed by applying insulating resin paste.

As FIG. 3 and FIG. 4 illustrate, insulating layer 33 is disposed on each capacitor element 50. Insulating layer 33 covers cathode portion 52 of capacitor element 50 from a top end to approximately the center. Insulating layer 33 is disposed around cathode portion 52. Accordingly, the portion of cathode portion 52 of capacitor element 50 of first capacitor element unit 10 which is not covered with insulating layer 33 is opposed to insulating layer 33 of capacitor element 50 of second capacitor element unit 20. In a similar manner to first capacitor element unit 10, insulating layer 33 is disposed on cathode portion 52 of capacitor element 50 of second capacitor element unit 20.

Insulating layer 33 electrically insulates first capacitor element unit 10 and second capacitor element unit 20. First capacitor element unit 10 is electrically insulated from second cathode terminal 304. Second capacitor element unit 20 is electrically insulated from first cathode terminal 303.

In the case where cathode portions 52 of capacitor elements 50 of the same capacitor element unit are successively stacked, a conductive adhesive layer (not illustrated) made of conductive paste may be disposed between cathode portions 52 which are successively stacked. Cathode portions 52 of the same capacitor element unit are joined via the conductive adhesive layer.

First anode terminal 301, second anode terminal 302, first cathode terminal 303, and second cathode terminal 304 each are formed by processing a plate-like metal lead frame.

First anode mounting portion 13 has a bottom surface which includes first anode bottom exposed portion 15. Second anode mounting portion 23 has a bottom surface which includes second anode bottom exposed portion 25. First cathode mounting portion 14 has a bottom surface which includes first cathode bottom exposed portion 16. Second cathode mounting portion 24 has a bottom surface which includes second cathode bottom exposed portion 26. These bottom exposed portions are disposed in the same plane as bottom surface 31 of outer package 30, and have substantially rectangular shape.

Figure 5:
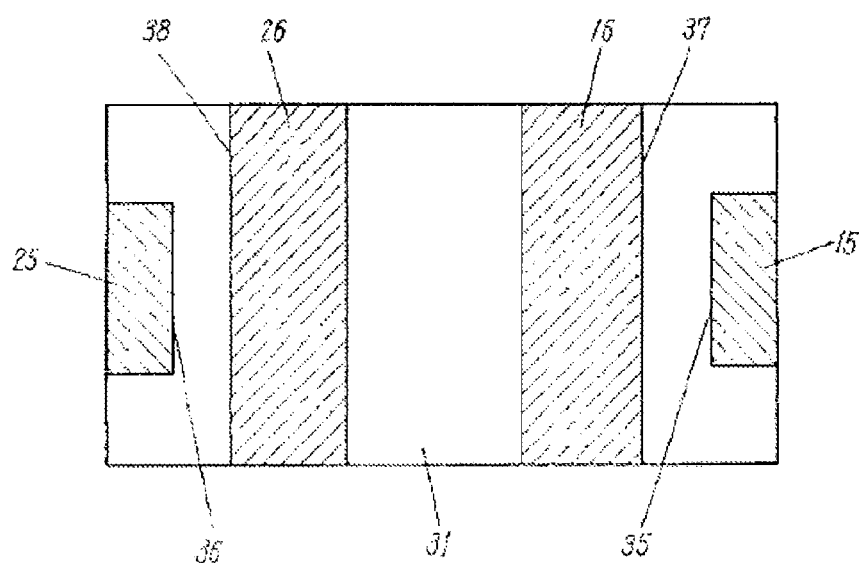
FIG. 5 is a bottom view of the solid electrolytic capacitor according to Embodiment 1.

As FIG. 5 illustrates, first cathode bottom exposed portion 16 is disposed between first anode bottom exposed portion 15 and second cathode bottom exposed portion 26. In other words, first cathode bottom exposed portion 16 is disposed on a straight line connecting the center of first anode bottom exposed portion 15 and the center of second cathode bottom exposed portion 26. Second cathode bottom exposed portion 26 is disposed between second anode bottom exposed portion 25 and first cathode bottom exposed portion 16.

First anode bottom exposed portion 15 is disposed along the bottom of a first end face of outer package 30, and extends toward the bottoms of a first side face and a second side face of outer package 30. Second anode bottom exposed portion 25 is disposed along the bottom of a second end face of outer package 30, and extends toward the bottoms of the first side face and the second side face of outer package 30.

Here, the first end face and the second end face are opposite to each other, and are perpendicular to bottom surface 31 of outer package 30. The first side face and the second side face are opposite to each other, and are perpendicular to bottom surface 31 of outer package 30, the first end face, and the second end face.

First anode bottom exposed portion 15 has side 35 which faces side 37 of first cathode bottom exposed portion 16. The entirety of side 35 is parallel to and opposite to at least a portion of side 37. Second anode bottom exposed portion 25 also has side 36 which faces side 38 of second cathode bottom exposed portion 26. The entirety of side 36 is parallel to and opposite to at least a portion of side 38.

For example, the shortest distance between first anode bottom exposed portion 15 and first cathode bottom exposed portion 16 is less than the shortest distance between first cathode bottom exposed portion 16 and second cathode bottom exposed portion 26. Moreover, for example, the shortest distance between second anode bottom exposed portion 25 and second cathode bottom exposed portion 26 is less than the shortest distance between first cathode bottom exposed portion 16 and second cathode bottom exposed portion 26. Such a structure allows the anode bottom exposed portions and the cathode bottom exposed portions to be proximally positioned, resulting in a reduction in current path inside the capacitor. Such a reduced path leads to an improved impedance characteristic.

Figure 6:
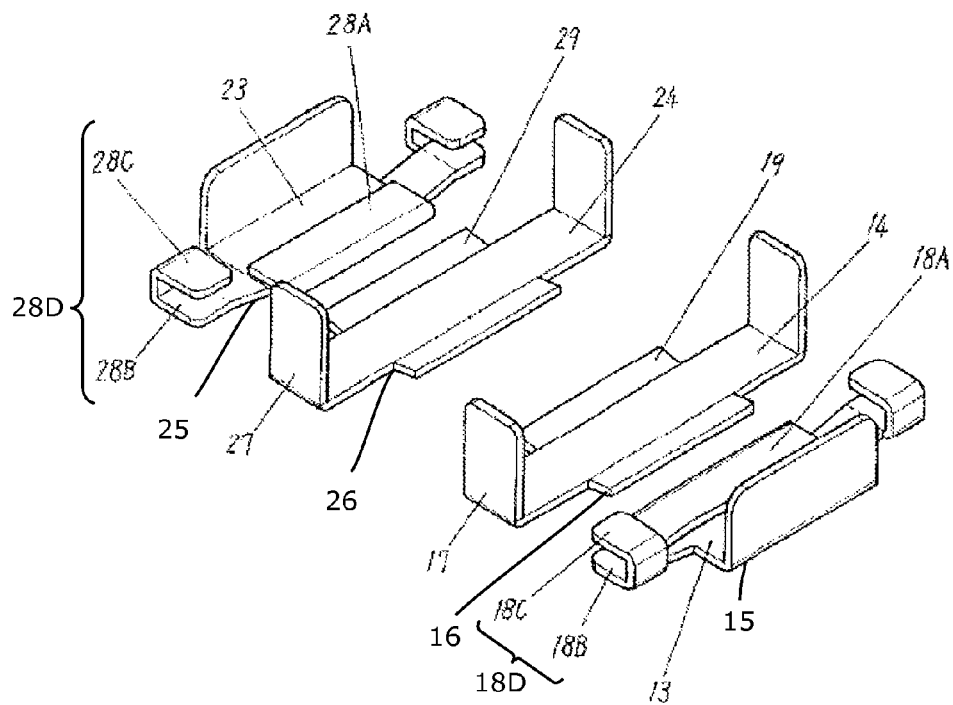
FIG. 6 is a perspective view of anode terminals and cathode terminals according to Embodiment 1.

As FIG. 6 illustrates, protrusions 19 are disposed at opposite sides of first cathode bottom exposed portion 16 of first cathode mounting portion 14. Protrusions 29 are disposed at opposite sides of second cathode bottom exposed portion 26 of second cathode mounting portion 24. Protrusions 19 and 29 extend diagonally upward from the respective sides. Such a structure avoids external entry of moisture.

Moreover, a pair of cathode holders 17 is disposed on opposite ends of first cathode mounting portion 14. A pair of second cathode holders 27 is disposed on opposite ends of second cathode mounting portion 24.

The cathode layer of the cathode portion located at the bottom of cathode stack 32 is joined to the upper surface of first cathode mounting portion 14 and the upper surface of second cathode mounting portion 24 via conductive adhesive layer 34. In FIG. 3, insulating layer 33 which covers cathode portion 52 of capacitor element 50 of second capacitor element unit 20 is joined to first cathode mounting portion 14. The portion of the cathode layer which is not covered with insulating layer 33 is joined to second cathode mounting portion 24.

First cathode holders 17 and second cathode holders 27 are joined to the side faces of respective capacitor elements of cathode stack 32 via conductive paste.

With the conductive paste, first cathode holders 17 are joined to the cathode layer, which is not covered with insulating layer 33, of each capacitor element of first capacitor element unit 10. Moreover, first cathode holders 17 are joined to insulating layer 33 covering the cathode layer of each capacitor element of second capacitor element unit 20. Second cathode holders 27 are joined to the cathode layer, which is not covered with insulating layer 33, of each capacitor element of second capacitor element unit 20. Moreover, second cathode holders 27 are joined to insulating layer 33 covering the cathode layer of each capacitor element of first capacitor element unit 10.

First anode mounting portion 13 includes central mounting portion 18A and opposite-ends mounting portions 18D. Second anode mounting portion 23 includes central mounting portion 28A and opposite-ends mounting portions 28D. First anode portion 11 of first capacitor element unit 10 is mounted at central mounting portion 18A and opposite-ends mounting portions 18D of first anode mounting portion 13. Second anode portion 21 of second capacitor element unit 20 is mounted at central mounting portion 28A and opposite-ends mounting portions 28D of second anode mounting portion 23.

Central mounting portions 18A and 28A are formed by folding over opposing sides of first anode bottom exposed portion 15 and second anode bottom exposed portion 25, respectively. Opposite-ends mounting portions 18D extend diagonally upward from opposite ends of first anode bottom exposed portion 15. Opposite-ends mounting portions 18D each include, at upper end, flat upper end portion 18B. Upper end portion 18B has pinch portion 18C bent so as to pinch first anode portion 11. Opposite-ends mounting portions 28D extend diagonally upward from opposite ends of second anode bottom exposed portion 25. Opposite-ends mounting portions 28D each include, at upper end, flat upper end portion 28B. Upper end portion 28B has pinch portion 28C bent so as to pinch second anode portion 21.

First anode portion 11 is mounted on the upper surfaces of upper end portions 18B of first anode mounting portion 13. Second anode portion 21 is mounted on the upper surfaces of upper end portions 28B of second anode mounting portion 23. By performing laser welding, resistance welding or the like from above pinch portions 18C and 28C, first anode portion 11 is joined to upper end portions 18B and pinch portions 18C, and second anode portion 21 is joined to upper end portions 28B and pinch portions 28C. Central mounting portions 18A and 28A respectively support first anode portion 11 and second anode portion 21.

First anode bottom exposed portion 15 is disposed immediately below first anode portion 11. Second anode bottom exposed portion 25 is disposed immediately below second anode portion 21. First cathode bottom exposed portion 16 is disposed immediately below first cathode portion 12. Second cathode bottom exposed portion 26 is disposed immediately below second cathode portion 22.

Figure 8:
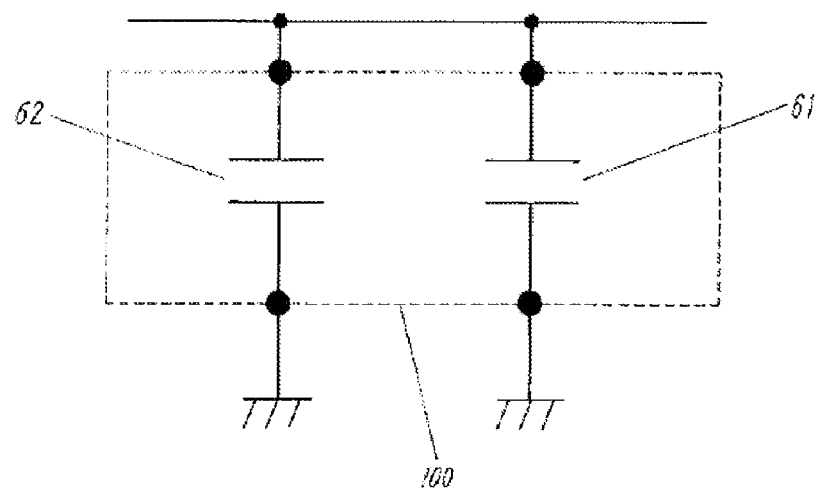
FIG. 8 is an equivalent circuit diagram of the solid electrolytic capacitor according to Embodiment 1 mounted on a circuit board.

FIG. 8 illustrates an equivalent circuit of a bypass solid electrolytic capacitor connected between a power supply line and ground. Two capacitors 61 and 62 respectively correspond to first capacitor element unit 10 and second capacitor element unit 20 of solid electrolytic capacitor 100 according to Embodiment 1. One solid electrolytic capacitor 100, serving as two capacitors 61 and 62, is connectable to a circuit board. Such a structure reduces flow of a current of one capacitor into another capacitor in the high-frequency region. Accordingly, the impedance characteristic in the high-frequency region is improved.

Figure 1:
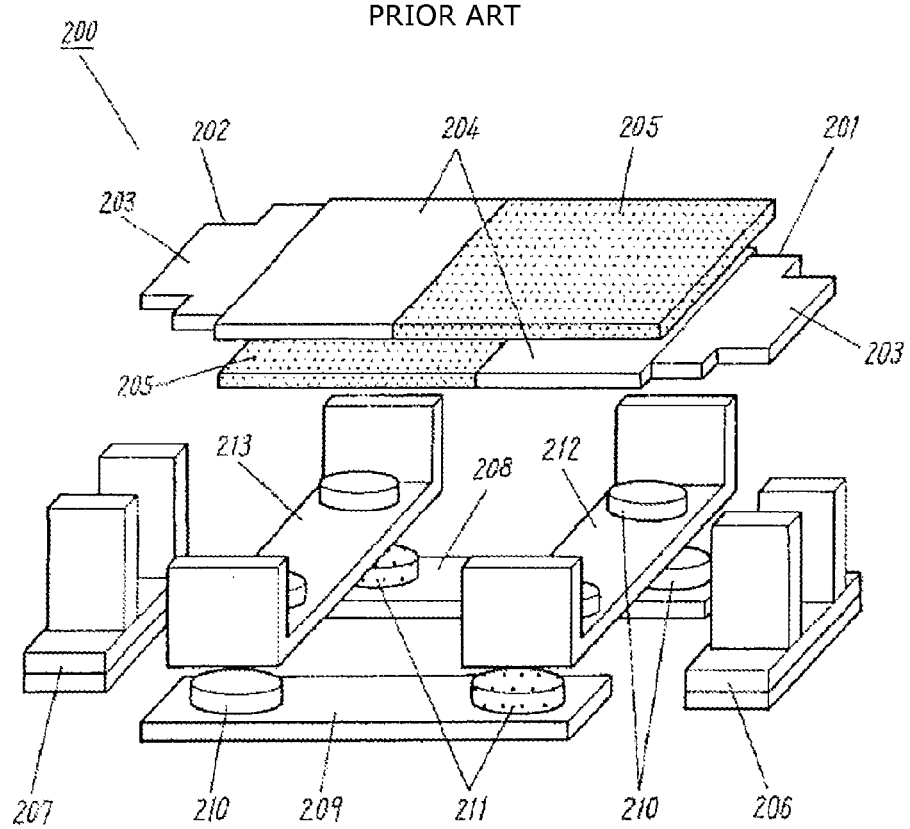
FIG. 1 is an exploded perspective view of a conventional solid electrolytic capacitor.

Additionally, the distance between each capacitor element and the mounting surface in solid electrolytic capacitor 100 according to Embodiment 1 can be reduced in comparison to conventional solid electrolytic capacitor 200 illustrated in FIG. 1. Such a reduction in distance leads to lower ESR and lower ESL. Accordingly, the impedance characteristic in the high-frequency region is improved.

Moreover, the entirety of side 35 of first anode bottom exposed portion 15 is opposite to side 37 of first cathode bottom exposed portion 16. The entirety of side 36 of second anode bottom exposed portion 25 is opposite to side 38 of second cathode bottom exposed portion 26. Hence, the magnetic fields cancel each other. This allows a circuit design including a solid electrolytic capacitor with an apparently improved impedance characteristic.

As described above, the solid electrolytic capacitor according to Embodiment 1 has an improved impedance characteristic in the high-frequency region.

Embodiment 2

In Embodiment 2, a mounting assembly including a solid electrolytic capacitor will be described.

A solid electrolytic capacitor used in Embodiment 2 is solid electrolytic capacitor 100 according to Embodiment 1.

Figure 9:
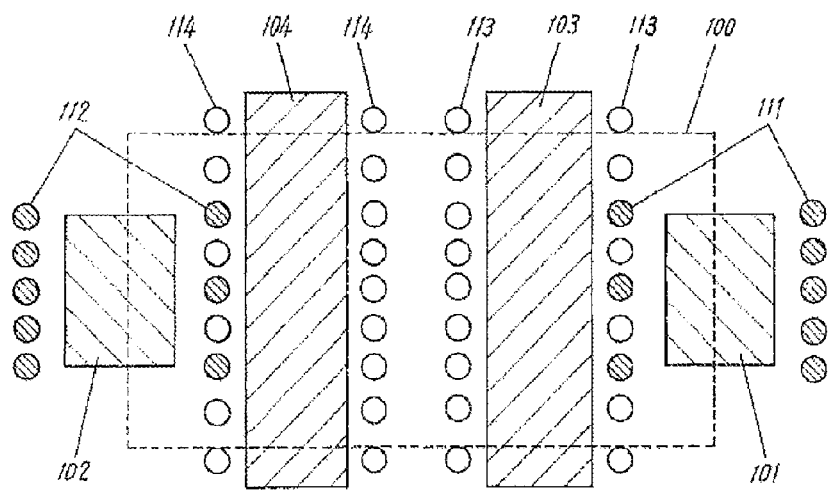
FIG. 9 is a top view of a mounting assembly including a circuit board on which a solid electrolytic capacitor is mounted, according to Embodiment 2.

As FIG. 9 illustrates, a circuit board has an upper surface on which first anode land 101, second anode land 102, first cathode land 103, and second cathode land 104 which are respectively joined, via solder, to first anode bottom exposed portion 15, second anode bottom exposed portion 25, first cathode bottom exposed portion 16, and second cathode bottom exposed portion 26.

Here, the dashed lines indicate the contour of solid electrolytic capacitor 100.

First anode via holes 111, second anode via holes 112, first cathode via holes 113, and second cathode via holes 114 are respectively and electrically connected to first anode land 101, second anode land 102, first cathode land 103, and second cathode land 104.

First anode via holes 111 are disposed on opposite sides of first anode land 101. In a similar manner, each kind of via holes are disposed on opposite sides of the corresponding land.

First anode land 101, second anode land 102, first cathode land 103, and second cathode land 104 each extend along a line parallel to axis Y which is orthogonal to axis X connecting first anode land 101 and second anode land 102. First cathode land 103 and second cathode land 104 are longer than first anode land 101 and second anode land 102 in the Y-axis direction.

Some of first anode via holes 111 are disposed in a region between first anode land 101 and first cathode land 103. Some of first anode via holes 111, which are disposed in the region between first anode land 101 and first cathode land 103, are aligned with first cathode via holes 113 and parallel to Y-axis. Likewise, some of second anode via holes 112 are disposed in a region between second anode land 102 and second cathode land 104. Some of second anode via holes 112, which are disposed in the region between second anode land 102 and second cathode land 104, are aligned with second cathode via holes 114.

First anode via holes 111, which are disposed in the region between first anode land 101 and first cathode land 103, and first cathode via holes 113 are alternately disposed. Likewise, second anode via holes 112, which are disposed in the region between second anode land 102 and second cathode land 104, and first cathode via holes 114 are alternately disposed. This causes the magnetic fields to cancel each other, leading to an apparently improved impedance characteristic of the solid electrolytic capacitor.

On the other hand, first cathode via holes 113 and second cathode via holes 114, which are disposed in a region between first cathode land 103 and second cathode land 104, are aligned in different lines which are spaced from each other by a predetermined distance and parallel to the Y-axis direction.

First anode via holes 111 and first cathode via holes 113, which are disposed in the region between first anode land 101 and first cathode land 103, may be aligned in different lines along the Y-axis direction.

Moreover, the shortest distance between first anode land 101 and first cathode land 103 is, for example, less than that between first cathode land 103 and second cathode land 104. The magnitude relationship of the above distance leads to a reduction in current path. This apparently improves the impedance characteristic of the solid electrolytic capacitor.

Next, a mounting assembly according to a comparative example will be described.

Figure 2:
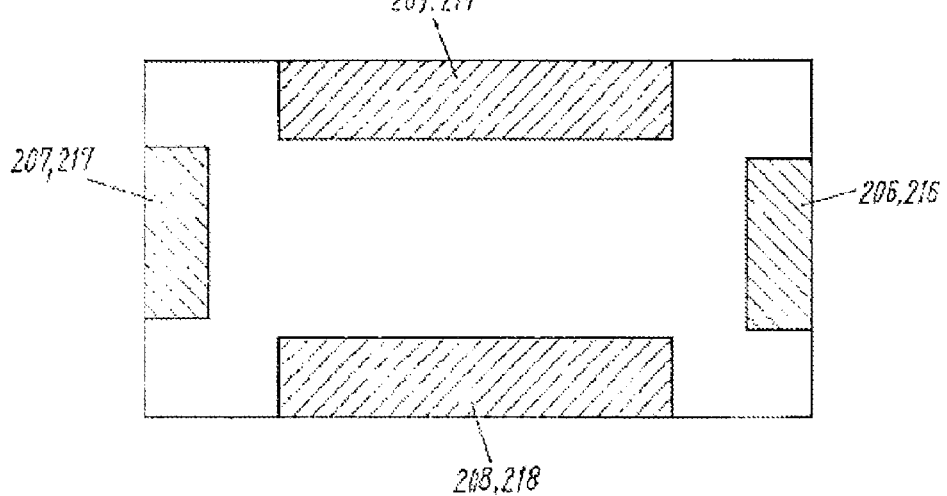
FIG. 2 is a bottom view of the conventional solid electrolytic capacitor.

A solid electrolytic capacitor according to a comparative example is conventional solid electrolytic capacitor 200 illustrated in FIG. 1 and FIG. 2.

Figure 10:
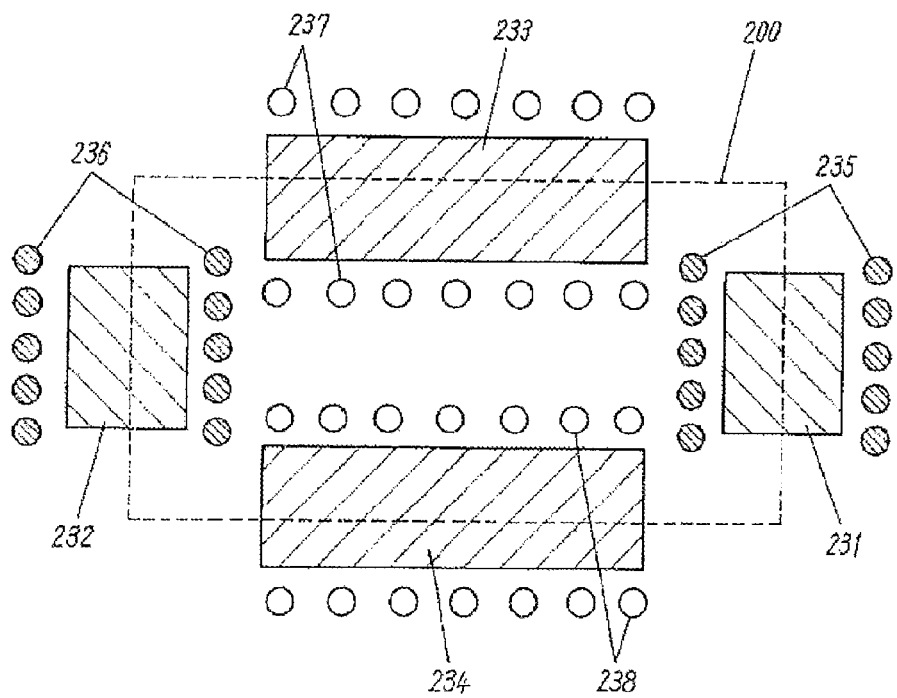
FIG. 10 is a top view of a mounting assembly including a circuit board on which a solid electrolytic capacitor is mounted, according to a comparative example.

As FIG. 10 illustrates, anode land 231, anode land 232, cathode land 233, and cathode land 234 are respectively joined to first anode terminal 206, second anode terminal 207, first cathode terminal 208, and second cathode terminal 209 of solid electrolytic capacitor 200 according to the comparative example.

Two anode lands 231 and 232 are disposed along Y-axis. Two cathode lands 233 and 234 are disposed along X-axis orthogonal to Y-axis.

Cathode via holes 237 connected to cathode land 233 and cathode via holes 238 connected to cathode land 234 are disposed parallel to each other along X-axis in a region between cathode lands 233 and 234. On the other hand, anode via holes 235 connected to anode land 231 and anode via holes 236 connected to anode land 232 are disposed parallel to each other along Y-axis in a region between anode land 231 and anode land 232.

Only the end portions of the lines of cathode via holes 237 and 238 are positioned proximally to the lines of anode via holes 235 and 236.

Accordingly, the distance between first anode via holes 111 and first cathode via holes 113 in the circuit board illustrated in FIG. 9 according to Embodiment 2 can be reduced in comparison to the circuit board illustrated in FIG. 10 according to the comparative example. Additionally, the number of positions where first anode via holes 111 and first cathode via holes 113 are proximally positioned can be increased. In a similar manner, second anode via holes 112 and second cathode via holes 114 can be proximally positioned. This causes the magnetic fields to cancel each other, leading to an apparently improved impedance characteristic of the solid electrolytic capacitor.

A solid electrolytic capacitor according to the present disclosure has an excellent impedance characteristic in the high-frequency region. The solid electrolytic capacitor according to the present disclosure is useful as a surface-mount capacitor.

What is claimed is:

1. A solid electrolytic capacitor comprising:
a first capacitor element unit including a first anode portion and a first cathode portion;
a second capacitor element unit including a second anode portion and a second cathode portion, the second capacitor element unit being electrically insulated from the first capacitor element unit;
an outer package which covers the first capacitor element unit and the second capacitor element unit;
a first anode bottom exposed portion exposed from the outer package, the first anode bottom exposed portion being electrically connected to the first anode portion;
a first cathode bottom exposed portion exposed from the outer package, the first cathode bottom exposed portion being electrically connected to the first cathode portion;
a second anode bottom exposed portion exposed from the outer package, the second anode bottom exposed portion being electrically connected to the second anode portion; and
a second cathode bottom exposed portion exposed from the outer package, the second cathode bottom exposed portion being electrically connected to the second cathode portion,
wherein a bottom surface of the outer package has the first anode bottom exposed portion, the first cathode bottom exposed portion, the second anode bottom exposed portion, and the second cathode bottom exposed portion,
the first cathode bottom exposed portion is disposed between the first anode bottom exposed portion and the second cathode bottom exposed portion, and
the second cathode bottom exposed portion is disposed between the second anode bottom exposed portion and the first cathode bottom exposed portion.

2. The solid electrolytic capacitor according to claim 1, comprising
a cathode stack in which the first cathode portion and the second cathode portion are stacked,
wherein the first anode portion is disposed opposite to the second anode portion across the cathode stack.

3. The solid electrolytic capacitor according to claim 1, wherein the first anode bottom exposed portion has a side which faces a side of the first cathode bottom exposed portion, an entirety of the side of the first anode bottom exposed portion being opposite to at least a portion of the side of the first cathode bottom exposed portion.

4. The solid electrolytic capacitor according to claim 1, wherein the second anode bottom exposed portion has a side which faces a side of the second cathode bottom exposed portion, an entirety of the side of the second anode bottom exposed portion being opposite to at least a portion of the side of the second cathode bottom exposed portion.

5. The solid electrolytic capacitor according to claim 1, wherein a shortest distance between the first anode bottom exposed portion and the first cathode bottom exposed portion is less than a shortest distance between the first cathode bottom exposed portion and the second cathode bottom exposed portion.

6. The solid electrolytic capacitor according to claim 1, wherein a shortest distance between the second anode bottom exposed portion and the second cathode bottom exposed portion is less than a shortest distance between the first cathode bottom exposed portion and the second cathode bottom exposed portion.

7. The solid electrolytic capacitor according to claim 1, wherein the first cathode bottom exposed portion is disposed immediately below the first cathode portion, and the second cathode bottom exposed portion is disposed immediately below the second cathode portion.

8. The solid electrolytic capacitor according to claim 1, comprising:
projections extending upward from opposite sides of the first cathode bottom exposed portion; and
projections extending upward from opposite sides of the second cathode bottom exposed portion.

9. The solid electrolytic capacitor according to claim 1, comprising:
a first anode mounting portion on which the first anode portion is mounted; and
a second anode mounting portion on which the second anode portion is mounted,
wherein the first anode mounting portion includes a central mounting portion on which the first anode portion of the first capacitor element unit is mounted, the central mounting portion being formed of a lead frame folded over upward, and
the second anode mounting portion includes a central mounting portion on which the second anode portion of the second capacitor element unit is mounted, the central mounting portion being formed of a lead frame folded over upward.

10. The solid electrolytic capacitor according to claim 1, wherein each of the first capacitor element unit and the second capacitor element unit includes one or more capacitor elements each including an anode portion and a cathode portion, and
the solid electrolytic capacitor comprises a stack in which the cathode portion of at least one of the one or more capacitor elements of the first capacitor element unit and the cathode portion of at least one of the one or more capacitor elements of the second capacitor element unit are alternately stacked.

11. A mounting assembly comprising:
a circuit board; and
the solid electrolytic capacitor according to claim 1, mounted on the circuit board.

12. The mounting assembly according to claim 11, wherein the circuit board includes:
a first anode land and a first anode via hole which are connected to the first anode bottom exposed portion;
a first cathode land and a first cathode via hole which are connected to the first cathode bottom exposed portion;
a second anode land and a second anode via hole which are connected to the second anode bottom exposed portion; and
a second cathode land and a second cathode via hole which are connected to the second cathode bottom exposed portion, and the first anode via hole and the first cathode via hole are alternately aligned in a region between the first anode land and the first cathode land.

13. The mounting assembly according to claim 12, wherein the second anode via hole and the second cathode via hole are alternately aligned in a region between the second anode land and the second cathode land.

* * * * *